(12) United States Patent
Archer et al.

(10) Patent No.: US 7,397,103 B2
(45) Date of Patent: Jul. 8, 2008

(54) SEMICONDUCTOR WITH DAMAGE DETECTION CIRCUITRY

(75) Inventors: Vance D. Archer, Eatontown, NJ (US); Daniel P. Chesire, Winter Garden, FL (US); Seung H. Kang, Sinking Spring, PA (US); Taeho Kook, Orlando, FL (US); Sailesh M. Merchant, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 280 days.

(21) Appl. No.: 11/237,633

(22) Filed: Sep. 28, 2005

(65) Prior Publication Data

US 2007/0069365 A1    Mar. 29, 2007

(51) Int. Cl.
*H01L 23/485* (2006.01)

(52) U.S. Cl. .................. 257/484; 257/758; 257/700; 257/E23.019

(58) Field of Classification Search ................ 257/484, 257/758, 700, E23.019, E23.142
See application file for complete search history.

(56) References Cited

U.S. PATENT DOCUMENTS

| | | | |
|---|---|---|---|
| 6,747,349 B1 * | 6/2004 | Al-Dabagh et al. | 257/691 |
| 2003/0205737 A1 * | 11/2003 | Fenner et al. | 257/200 |
| 2004/0085099 A1 * | 5/2004 | Ratchkov et al. | 327/100 |
| 2004/0150070 A1 * | 8/2004 | Okada et al. | 257/508 |

\* cited by examiner

*Primary Examiner*—Evan Pert
*Assistant Examiner*—Victor A. Mandala, Jr (57) ABSTRACT

Disclosed herein are novel damage detection circuitries implemented on the periphery of a semiconductor device. The circuitries disclosed herein enable the easy identification of cracks and deformation, and other types of damage that commonly occur during test and assembly processes of semiconductor devices.

13 Claims, 7 Drawing Sheets

SEMICONDUCTOR WITH DAMAGE DETECTION CIRCUITRY

BACKGROUND

During test and assembly operations, semiconductor devices are subject to large amounts of mechanical and thermal stresses. This is particularly true of devices with increasingly finer feature sizes, as the propensity for intra- and inter-level shorts caused by such operations drastically increases. Devices that have been diced, tested and assembled in packages often show signs of stress-related failures. These may be small microscopic cracks or highly visible stress-relief mechanisms such as film delamination, buckling, cracking, etc. In such cases, devices damage and attendant loss of useful life, leads to increased replacement costs. Moreover, these cracks and deformation-induced defects are difficult to detect, requiring large amounts of exhaustive failure analyses.

SUMMARY

The inventors have realized that there is a need for a method of quickly detecting assembly and test-related deformation of a semiconductor device that requires minimal engineering effort. According to one embodiment, the subject invention pertains to a chip edge and/or corner distortion and damage detection circuitry. This circuitry will assist in alleviating and resolving stress-induced failures from test and assembly operations. According to one embodiment, the damage detection circuits are placed along the periphery and corners of each device and requires no special or additional processing steps, thus its placement on the chip does not add to manufacturing costs. The detection circuits may be placed in close proximity to the seal ring at the device edge and corners. The detection circuitry allows electrical testing of the device in both wafer and package form, thus permitting the engineer to singulate the location of stress-induced defects and deformation such as cracking, delamination etc.

BRIEF DESCRIPTION OF THE DRAWINGS

FIG. 6 shows a serpentine circuitry embodiment.

DETAILED DESCRIPTION

According to one embodiment, the subject invention is directed to a semiconductor device comprising damage detection circuitry on at least a portion of a periphery of the semiconductor device. In a specific embodiment, the damage detection circuitry comprises one or more bands of conductive material disposed around the periphery of the semiconductor device. The detection circuitry is peripheral to the primary circuitry of the semiconductor device, and in those devices comprising a seal ring, inward from the seal ring.

Figure 1:
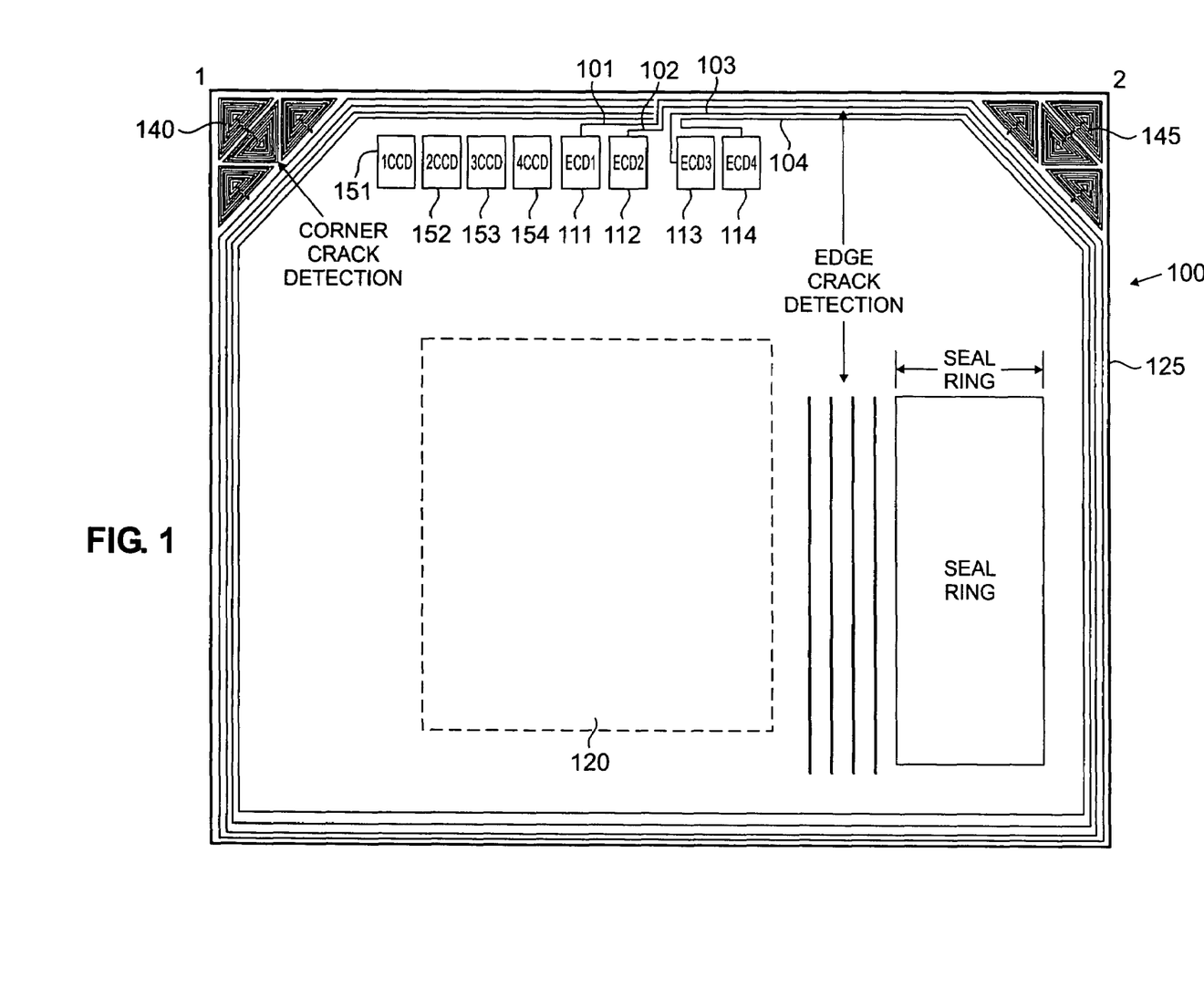
FIG. 1 shows a top view of a semiconductor device comprising detection circuitry.

Turning to the figures, FIG. 1 shows a top view of a semiconductor device 100 comprising four conductive bands 101, 102, 103, and 104 around the periphery of the device 100. Those skilled in the art will appreciate that the bands may completely follow the periphery or a portion of the periphery. Each of the conductive bands 101, 102, 103 and 104 are separately conductively connected to pads 111, 112, 113, and 114, respectively. The conductive bands 101-104 are not conductively connected to each other unless damage to the semiconductor device has occurred. This feature allows the testing for damage by applying a voltage or current to two or more of the pads 111-114 to measure change in resistance and/or determine if any short or open has occurred between any of the conductive bands 101-104. A typical method of determining if any short has occurred is measuring any change in the initial resistance of the band (e.g. prior to assembly) comparative to post assembly and/or calculated values (pre and/or post assembly). Shorting of any of the bands is indicative of damage to the semiconductor device 100, thereby enabling the engineer to diagnose and correct the cause of such damage. The semiconductor device 100 is comprised of alternating metallization layers and dielectric layers (not shown). Furthermore, the semiconductor device 100 comprises a primary integrated circuit 120 formed among such alternating layers. The conductive bands 101-104 are not conductively connected to the primary integrated circuit 120 and are positioned peripheral to said primary integrated circuit 120. Surrounding the periphery of the semiconductor device 100 is a seal ring 125.

Figure 5:
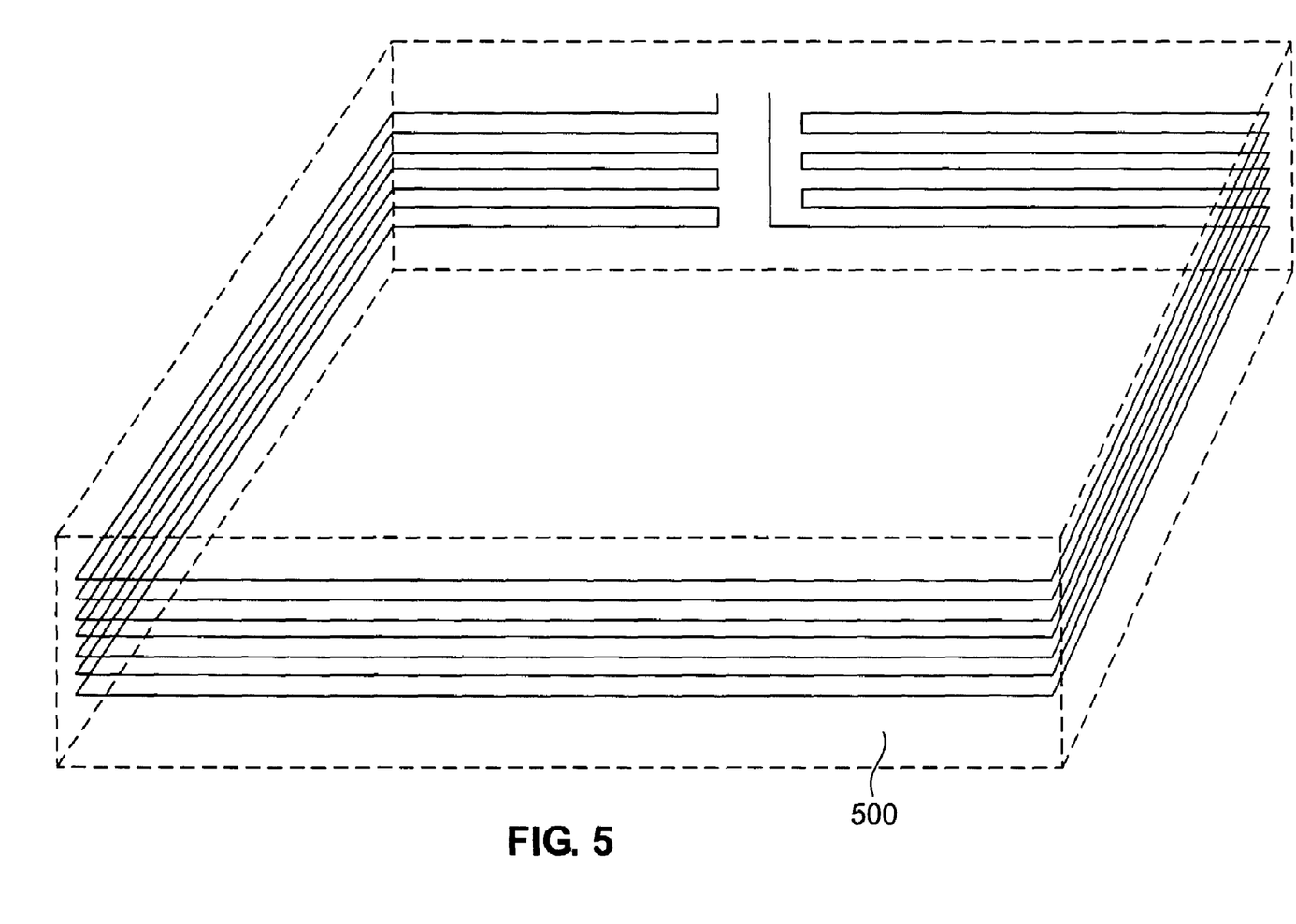
FIG. 5 shows an isometric view of a serpentine circuitry embodiment.

The conductive bands 101-104 may be formed in multiple metallization layers and interconnected through vias in the dielectric layers. Therefore, testing of one band will enable the determination of damage present among any of the constituent layers. The configuration of the interconnected bands may take several forms, as will be readily appreciated by those skilled in the art in light of the teachings herein. In a specific embodiment, the configuration is a serpentine structure: that is, the individual band courses around the periphery at a first metallization layer and then connects to a band in a second metallization layer through one or more vias at a location along the band (typically at the end of the band), then courses around the second metallization layer and connects to a band on a third layer through one or more vias located at a location along the band, and so on, until a continuous serpentine like structure is constructed through the desired number of metallization layers. An example of a serpentine structure 500 is depicted in FIG. 5. It is noted that the structure is not drawn to scale nor are the bends of the band for each layer shown. However, the important feature depicted in FIG. 5 is how the interconnected bands can form a continuous structure that may be formed around each metallization layer and are interconnected to lower metallization layers throughout the desired dimension of the semiconductor device. Furthermore, as depicted in FIG. 5, the interconnection to other layers may be attained through one or more vias at any suitable location around the periphery.

Also shown in FIG. 1 is novel corner circuitry 140 and 145 in corners 1 and 2, respectively, which enables particular sensitivity to cracks, deformations, and/or other damage at the corners of the semiconductor device 100. As noted above, corner cracking can occur from excessive stresses typically induced in the chip during testing, wire bonding, flip chip bonding, underfill, molding and other assembly operations. The corner circuitry 140 comprises four separate triangular units 141, 142, 143, and 144.

Figure 2:
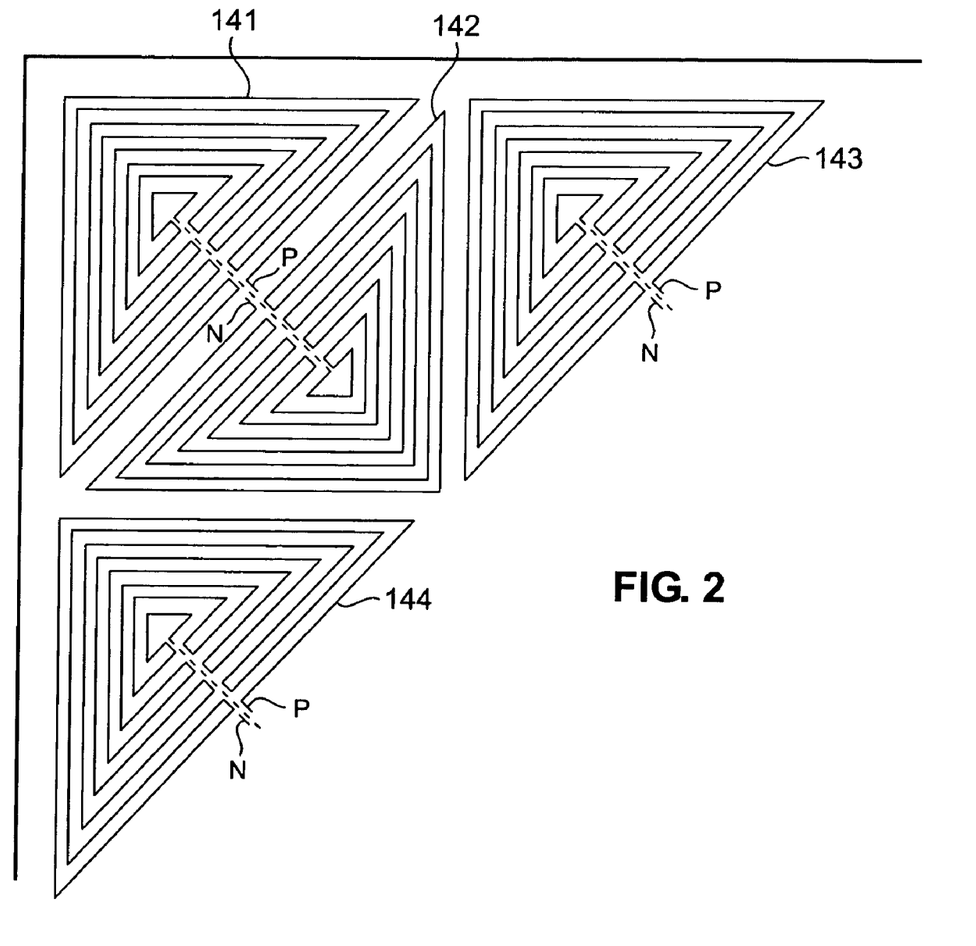
FIG. 2 is a magnified view of an embodiment of corner damage detection circuitry.

FIG. 2 is a magnified view of the corner circuitry 140 shown in FIG. 1. Each of the separate triangular units 141, 142, 143 and 144 are typically not conductively connected, but for damage to the corner 1 of the semiconductor device. Alternatively, those skilled in the art will appreciate that one or more of the units 141-144 may be connected to each other. Further, though not shown, the triangular units are typically conductively connected to triangular units on different metallization layers of the semiconductor device. This may be accomplished for example by way of a continuous serpentine structure similar to that shown and described for FIG. 5, or by way of a via type like structure where vias along the length of the band connect a band on one metallization layer to another metallization layer (see, for example FIG. 4). It is also noted that the shape of the unit circuitry is not critical. Those skilled in the art will appreciate that the units may be configured as one of many different shapes including, but not limited to, triangle, rectangle, square, or other polygonal shape, oval, circle, spiral, etc. The size of the shape can affect the level of resolution of the detection of mechanical problems. Typically, the smaller the size of the shapes the higher the resolution.

In the corner circuitry embodiment 140 shown in FIG. 1, the units 141-144 are each individually connected to a pad 151, 152, 153 and 154, respectively, formed on a top surface of the semiconductor device 100. There may be one pad per unit as shown, or two or more pads per unit. Those skilled in the art will appreciate that as more pads are connected to different locations of the circuitry, this will enable a higher degree of accuracy for fault identification and the identification for fault isolation of the area or place of damage. Though not particularly shown in FIG. 1, the units 141-144 of the corner circuitry 140 may be connected to units of the opposing corner circuitry 145. Referring back to FIG. 2, each of the triangular units 141-144 have a positive and negative lead (indicated by p and n). In a preferred embodiment, the p and n leads are each conductively connected to a pad on the semiconductor device 100. In alternative embodiments, the individual triangular units may be individually or collectively connected to one or more bands.

Figure 3:
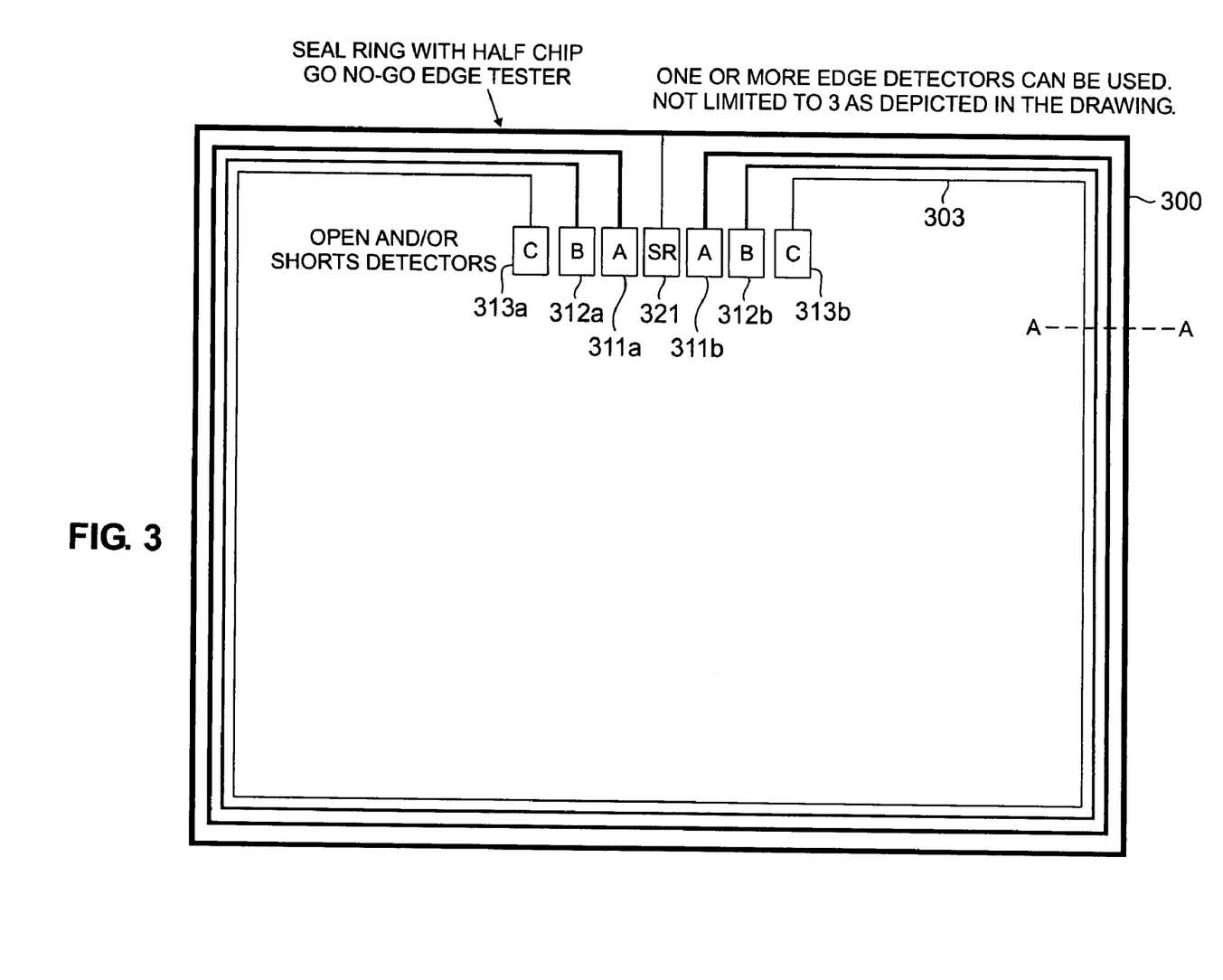
FIG. 3 shows a top view of a detection circuitry embodiment.

FIG. 3 is top view of a semiconductor device 300 comprising an alternative embodiment of damage detection circuitry. The semiconductor device 300 comprises three conductive bands 301, 302, and 303. The bands 301-303 are each conductively connected to a pad at each end: 311*a* and *b*, 312*a* and *b*, and 313*a* and *b*, respectively. Furthermore, peripheral to the conductive bands is a seal ring 320. The seal ring 320 is conductively connected to pad 321. This configuration enables one to determine whether any damage has occurred between the seal ring 320 and one of the bands.

Figure 4:
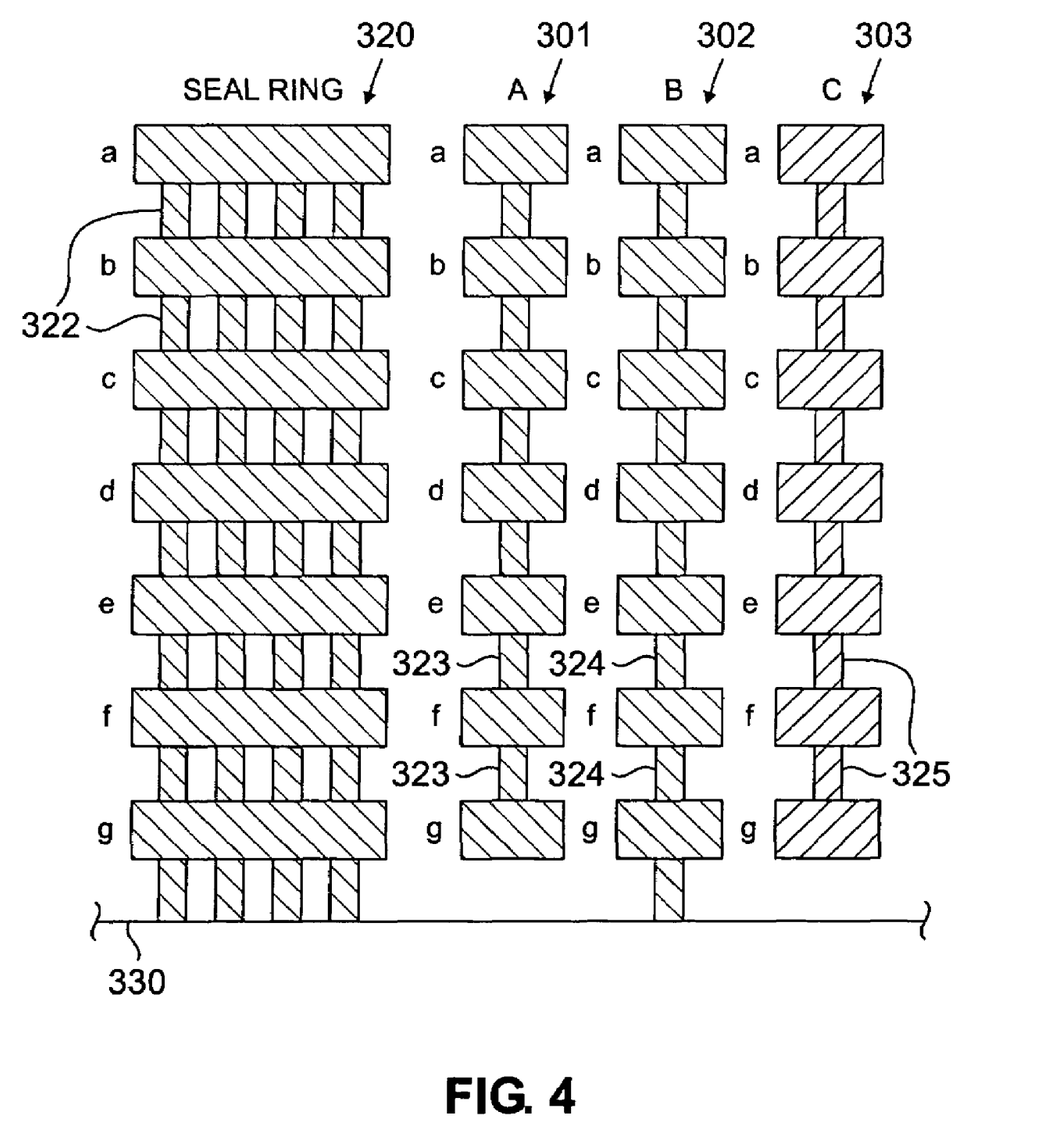
FIG. 4 shows a cross sectional view of along axis A-A in FIG. 3

FIG. 4 represents a cross section of the bands and seal ring along the A-A axis in FIG. 3. The seal ring 320 is shown as a series of bands 320*a-g* formed in each metallization layer where each band is interconnected by a plurality of vias 322. Conductive bands, 301-303 are shown as a series of bands 301*a-g*, 302*a-g*, and 303*a-g* formed in each metallization layer and interconnected by a vias 323, 324, and 325, respectively. The via structure provides a certain level of structural support and integrity. Thus, opens are not likely to occur, but shorts caused by leakage could still occur, and are detectable by the damage detection circuitry. Conductive bands 301 and 303 are free-floating i.e., they are not connected to the silicon base 330 of the semiconductor, whereas conductive band 302 is connected to the silicon base 330. Therefore, the conductive bands 301 and 303 act as monitor bands, i.e., enable testing for shorts that are indicative of damage. For example, when a tester is contacted with pad 312 and one of pads 311 and 313, the presence of a short in the circuit may be determined. In addition, the location of the short may be further isolated by comparing the current that occurs on the (a) and (b) pads of 312 and 311 and/or 313. Accordingly, bands 301 and 303 may be used to detect intralevel as well as interlevel opens and shorts. In an alternative embodiment, not shown, the metallization layers are of the conductive bands are not interconnected and each metallization layer of conductive bands are electrically connected to separate contact pads. This will further facilitate determining on which level(s) damage has occurred.

Figure 6A:
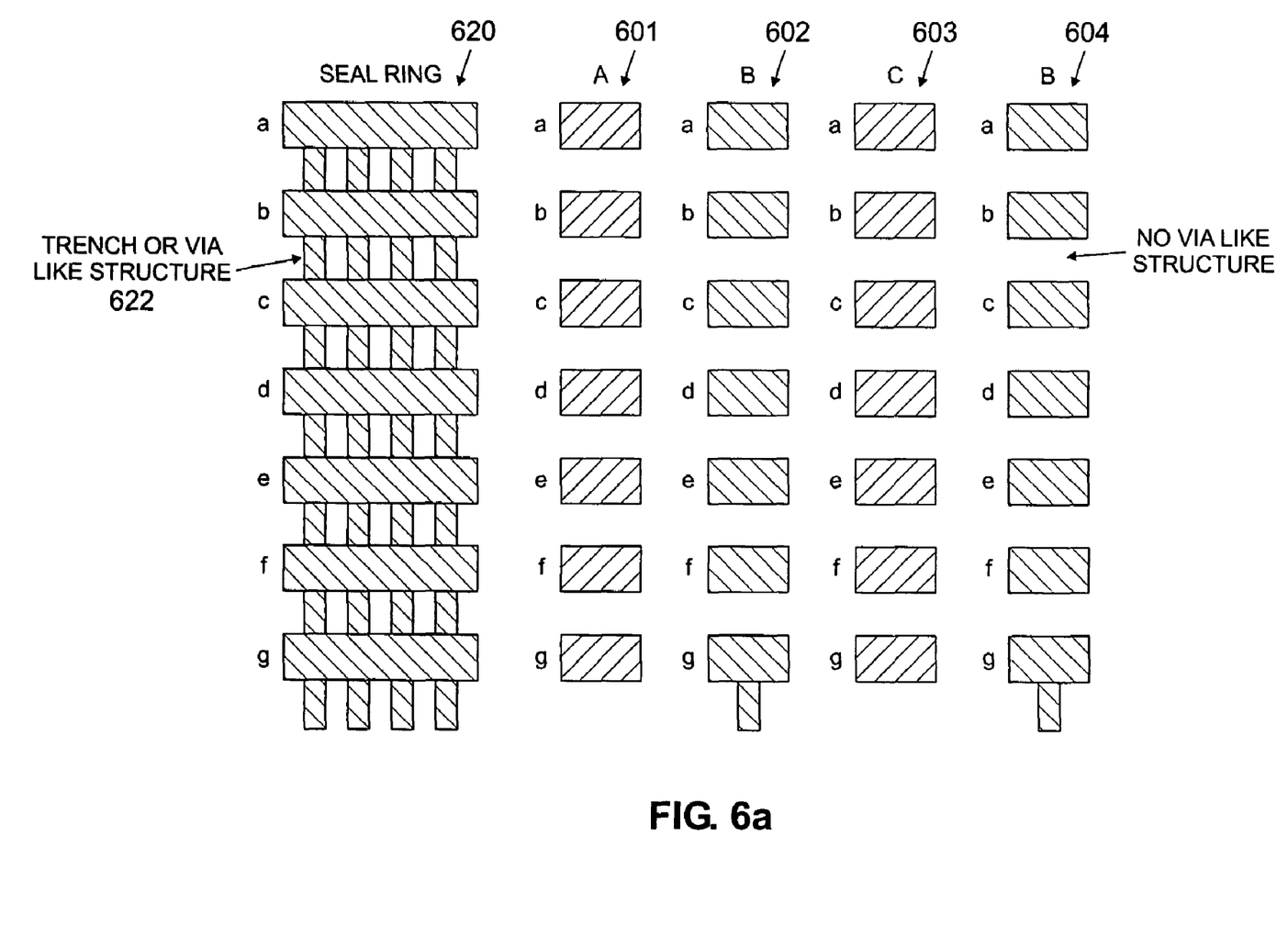
FIG. 6a shows a cross-sectional view at the arrowed location in FIG. 6b.
Figure 6B:
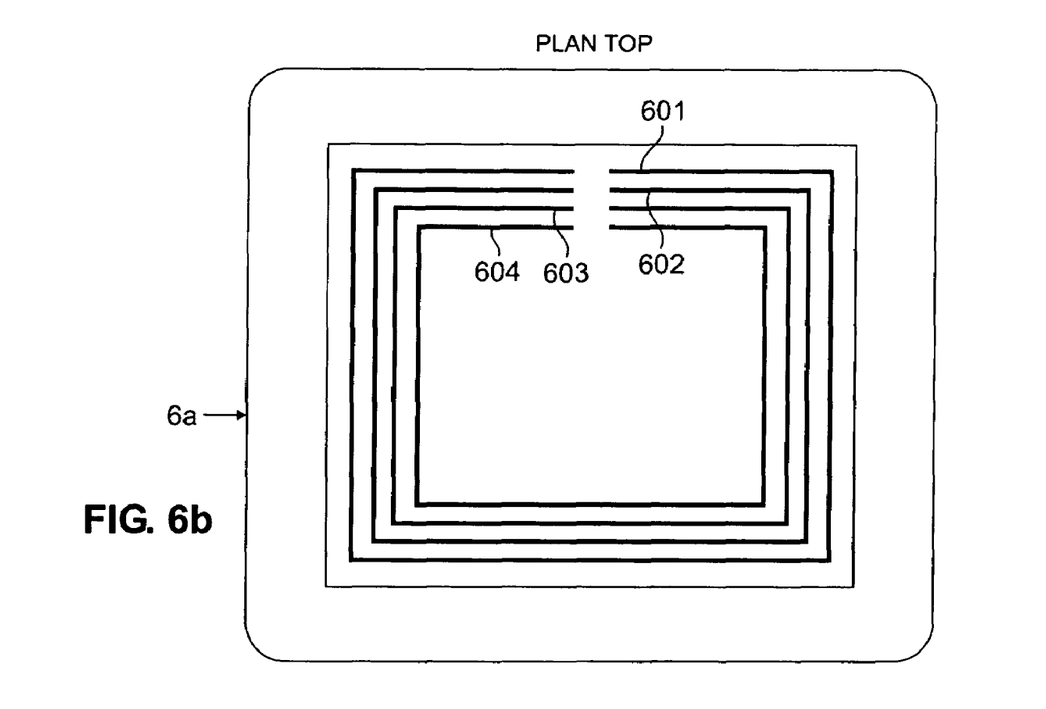
FIG. 6b shows a top plan view of a semiconductor device embodiment.
Figure 6C:
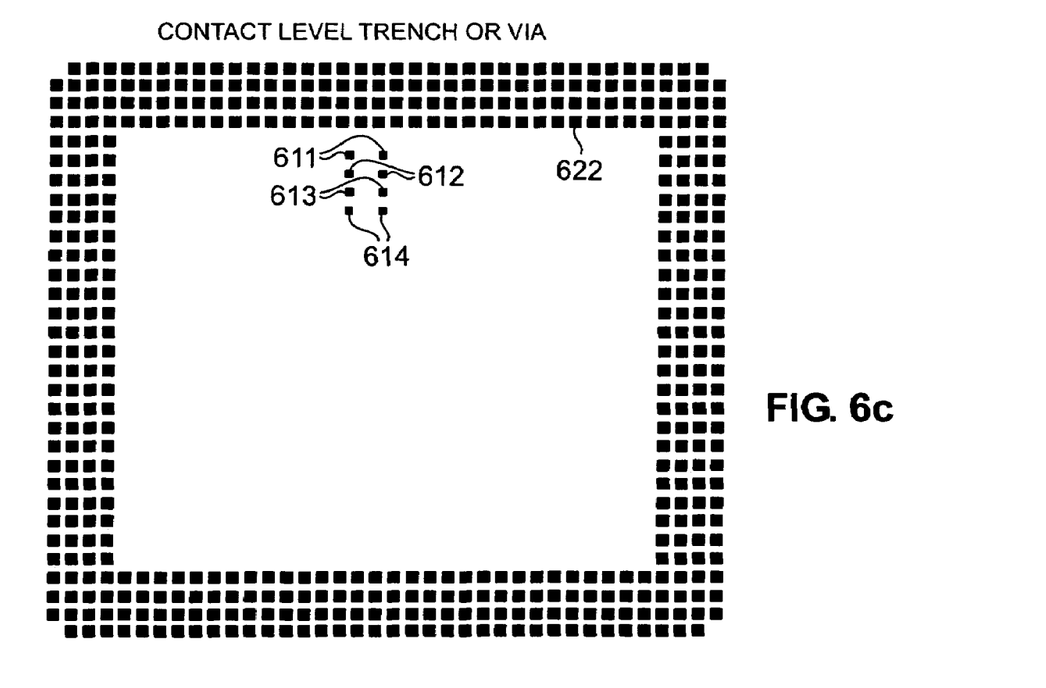
FIG. 6c shows a top plan view of the semiconductor device embodiment shown in FIG. 6b at a level immediately beneath the level shown in FIG. 6b.

FIG. 6*a* shows a cross section view of a semiconductor device 600 at the location indicated by the arrow in FIG. 6*b* (see arrow). Each conductive band 601, 602, 603, and 604 are a serpentine structure similar to that shown in FIG. 5 for one conductive band. Thus, at the cross-sectional location shown, there are no via-like structures interconnecting the bands at each level. In contrast, the seal ring 620 does comprise vias 622 that interconnect metallization layers. FIG. 6*b* shows a top plan view of the semiconductor device showing conductive bands 601-604. FIG. 6*c* shows a top plan view of layer immediately below that shown in FIG. 6*b*. The interconnections 611, 612, 613, 614 of the conductive bands connecting the conductive bands of top metallization layer with that of the next lower metallization layer are visible at this layer. The vias 622 interconnecting the top metallization layer of the seal ring 620 are also visible at this layer.

While some embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What is claimed is:

1. A semiconductor device comprising:
   a substrate,
   a plurality of alternating metallization layers and dielectric layers formed on said substrate;
   a primary integrated circuit formed by an interconnection of structures formed in two or more of said alternating metallization layers;
   a first conductive band formed in at least one of said metallization layers peripheral to said primary integrated circuit;
   a second conductive band formed in at least one of said metallization layers and peripheral to said first conductive band; wherein but for damage to said semiconductor device, said first and second conductive bands are not conductively connected; and
   a first pad and a second pad formed on a top surface of said semiconductor device, wherein said first and second pads are conductively connected to said first band and said second band, respectively.

2. The semiconductor device of claim 1, comprising a first set of three or more adjacent but separate conductive bands formed in a first metallization layer, and a second set of three or more adjacent but separate bands formed in a second metallization layer, said three or more bands of given set not being conductively connected to each other but for damage to said semiconductor device and said three or more conductive bands of said first set being individually conductively connected to corresponding conductive bands of said second set.

3. The semiconductor device of claim 2, further comprising three or more pads formed on a top surface of said semiconductor device each individually conductively connected to said three or more bands of said first and second sets.

4. The semiconductor device of claim 2, wherein each metallization layer of said semiconductor device comprises a set of three or more adjacent but separate conductive bands, wherein each conductive band on a metallization layer is conductively connected to a corresponding conductive band on a separate metallization layer.

5. The semiconductor device of claim 1, wherein said semiconductor device comprises a periphery and said first conductive band and said second conductive band are configured to follow around said periphery except that at least one corner of said periphery said first conductive band and said second conductive band angle inward to define a region at said at least one corner; and further comprising a separate corner circuitry formed in said region and configured for detecting damage to said corner region and, optionally, said separate corner circuitry conductively connected to either said first band or said second band.

6. The semiconductor device of claim 5, wherein said separate corner circuitry spans two or more metallization layers of said semiconductor device.

7. The semiconductor device of claim 5, wherein said corner circuitry is configured to detect intralevel and interlevel shorts and opens in said corner region.

8. The semiconductor device of claim 1, wherein said semiconductor device comprises a periphery and further comprises a seal ring peripheral to said first and second conductive bands and extends around said periphery.

9. The semiconductor device of claim 8, wherein said seal ring comprises a multilayer metal structure comprised of metal components formed in each metallization layer that are interconnected by vias formed in said dielectric layers.

10. The semiconductor device of claim 9, wherein said seal ring is conductively connected to at least one pad formed on a top surface of said semiconductor device.

11. A semiconductor device comprising:
a substrate,
a plurality of alternating metallization layers and dielectric layers formed on said substrate;
a primary integrated circuit formed by an interconnection structures formed in two or more of said alternating metallization layers;
a first upper conductive band formed in an first metallization layer said first upper conductive band peripheral to said primary integrated circuit; and
a second upper conductive band formed in said first metallization layer and peripheral to said first upper conductive band;
a first lower conductive band formed in a second metallization layer positioned beneath said first metallization layer;
a second lower conductive band formed in said second metallization layer and peripheral to said first lower conductive band; wherein but for damage to said semiconductor device, none of said first upper conductive band, said second upper conductive band, said first lower conductive band and said second lower conductive band are conductively connected; and
a series of pads formed on a top surface of said semiconductor device individually and separately conductively connected to said first upper conductive band, said second upper conductive band, said first lower conductive band and said second lower conductive band; whereby each conductive band may be individually tested to determine an occurrence of a short on or between a respective metallization layer.

12. A semiconductor device comprising:
a substrate,
a plurality of alternating metallization layers and dielectric layers formed on said substrate;
a primary integrated circuit formed by an interconnection of conductive structures formed in two or more of said alternating metallization layers;
a first upper conductive band formed in an first metallization layer said first upper conductive band peripheral to said primary integrated circuit; and
a second upper conductive band formed in said first metallization layer and peripheral to said first upper conductive band;
a first lower conductive band formed in a second metallization layer positioned beneath said first metallization layer and conductively connected to said first upper conductive band;
a second lower conductive band formed in said second metallization layer and peripheral to said first lower conductive band and conductively connected to said second upper conductive band; wherein but for damage to said semiconductor device, said first upper and lower conductive bands, are not conductively connected to said second upper and lower conductive bands; and
a series of pads formed on a top surface of said semiconductor device individually and separately conductively connected to said first upper and lower conductive bands, and said second upper and lower conductive bands.

13. The semiconductor device of claim 11, wherein said semiconductor device comprises a rectangular periphery and said first upper and lower conductive bands and said second upper and lower conductive bands are configured to follow said periphery in a serpentine fashion.

* * * * *